United States Patent
Wang et al.

(10) Patent No.: US 10,510,901 B2
(45) Date of Patent: Dec. 17, 2019

(54) THIN FILM TRANSISTOR AND FABRICATION METHOD THEREOF, ARRAY SUBSTRATE AND DISPLAY DEVICE

(71) Applicant: BOE Technology Group Co., Ltd., Beijing (CN)

(72) Inventors: Longyan Wang, Beijing (CN); Yongqian Li, Beijing (CN); Cuili Gai, Beijing (CN); Quanhu Li, Beijing (CN); Baoxia Zhang, Beijing (CN); Jingwen Yin, Beijing (CN); Kun Cao, Beijing (CN); Zhongyuan Wu, Beijing (CN); Gang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 125 days.

(21) Appl. No.: 15/127,262

(22) PCT Filed: Sep. 24, 2015

(86) PCT No.: PCT/CN2015/090550
§ 371 (c)(1),
(2) Date: Sep. 19, 2016

(87) PCT Pub. No.: WO2016/206206
PCT Pub. Date: Dec. 29, 2016

(65) Prior Publication Data
US 2018/0175204 A1    Jun. 21, 2018

(30) Foreign Application Priority Data
Jun. 24, 2015 (CN) .......................... 2015 1 0354328

(51) Int. Cl.
*H01L 29/76* (2006.01)
*H01L 29/786* (2006.01)
(Continued)

(52) U.S. Cl.
CPC ........ *H01L 29/7869* (2013.01); *H01L 27/127* (2013.01); *H01L 27/1225* (2013.01);
(Continued)

(58) Field of Classification Search
CPC ... H01L 27/12; H01L 27/1255; H01L 27/127; H01L 29/4908; H01L 29/7869
See application file for complete search history.

(56) References Cited

U.S. PATENT DOCUMENTS

2010/0193782 A1* 8/2010 Sakata ................ H01L 29/7869
257/43
2010/0224880 A1* 9/2010 Kimura ............... H01L 27/1225
257/59
(Continued)

FOREIGN PATENT DOCUMENTS

| CN | 101807586 A | 8/2010 |
| CN | 101901787 A | 12/2010 |

(Continued)

OTHER PUBLICATIONS

Apr. 17, 2018—(CN) Second Office Action Appn 201510354328.8 with English Translation.
(Continued)

*Primary Examiner* — Phuc T Dang
(74) *Attorney, Agent, or Firm* — Banner & Witcoff, Ltd.

(57) ABSTRACT

A thin film transistor and a fabrication method thereof, an array substrate and a display device are provided. The thin film transistor comprises a gate electrode, an active layer, a source electrode and a drain electrode. The source electrode and the drain electrode include a first conductive layer provided on the active layer, and an etching rate of a material of the first conductive layer is greater than an etching rate of a material of the active layer in an etching liquid. The problem that the active layer of the thin film transistor is
(Continued)

easily corroded in a back channel etch process is avoided, a number of patterning processes is reduced, and fabrication cost is reduced.

18 Claims, 3 Drawing Sheets

(51) Int. Cl.
| | | |
|---|---|---|
| *H01L 27/12* | (2006.01) | |
| *H01L 27/32* | (2006.01) | |
| *H01L 29/417* | (2006.01) | |
| *H01L 29/423* | (2006.01) | |
| *H01L 29/66* | (2006.01) | |

(52) U.S. Cl.
CPC ...... *H01L 27/1288* (2013.01); *H01L 27/3262* (2013.01); *H01L 29/41733* (2013.01); *H01L 29/42384* (2013.01); *H01L 29/66969* (2013.01)

(56) References Cited

U.S. PATENT DOCUMENTS

| | | | | |
|---|---|---|---|---|
| 2011/0006300 A1* | 1/2011 | Mochizuki | ........ | H01L 21/02554 257/43 |
| 2011/0240592 A1* | 10/2011 | Matsubara | ...... | H01L 31/022466 216/13 |
| 2011/0309336 A1* | 12/2011 | Shin | ....... | B82Y 10/00 257/29 |
| 2012/0181557 A1* | 7/2012 | Kim | .......... | H01L 27/1259 257/98 |
| 2012/0241776 A1 | 9/2012 | Liu | | |
| 2014/0077213 A1 | 3/2014 | Zhang et al. | | |
| 2015/0155362 A1* | 6/2015 | Nakazawa | ....... | H01L 29/45 257/43 |
| 2016/0163866 A1* | 6/2016 | Kim | ........ | H01L 29/66969 257/43 |

FOREIGN PATENT DOCUMENTS

| | | |
|---|---|---|
| CN | 102637591 A | 8/2012 |
| CN | 102646630 A | 8/2012 |
| CN | 102709234 A | 10/2012 |
| CN | 102769040 A | 11/2012 |
| CN | 103337462 A | 10/2013 |
| CN | 103794652 A | 5/2014 |

OTHER PUBLICATIONS

Uhm, et al., "A Two-Mask Process for Fabrication of Bottom-Gate IGZO-Based TFTS", IEEE Electron Device Letters, vol. 33, No. 4, Apr. 2012, pp. 543-545.

Xu, et al., "High Performance Indium-zinc-oxide Thin-film Transistors Fabricated with a Back-channel-etch-Technique", Applied Physics Letters 99, 2011, pp. 1-4.

Feb. 4, 2016—(WO)—International Search Report and Written Opinion Appn PCT/CN2015/090550 with English Tran.

Aug. 11, 2017—(CN) First Office Action Appn 201510354328.8 with English Tran.

\* cited by examiner

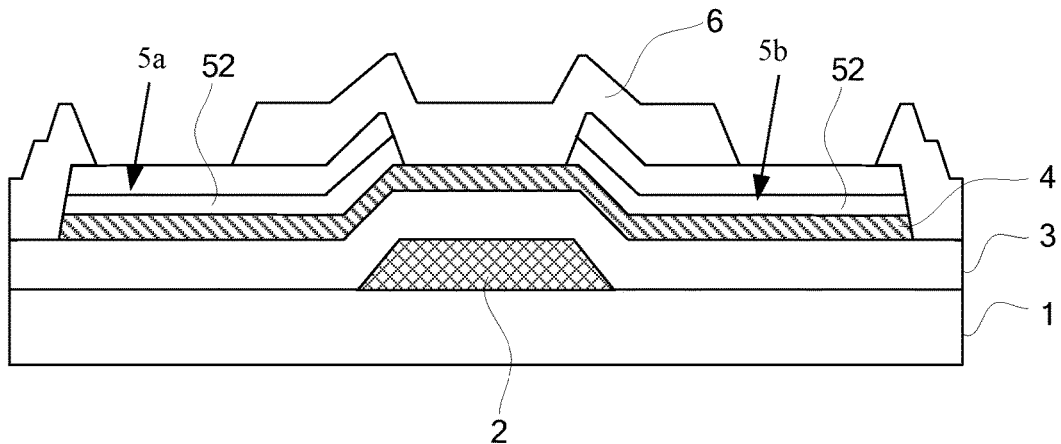

FIG. 1a

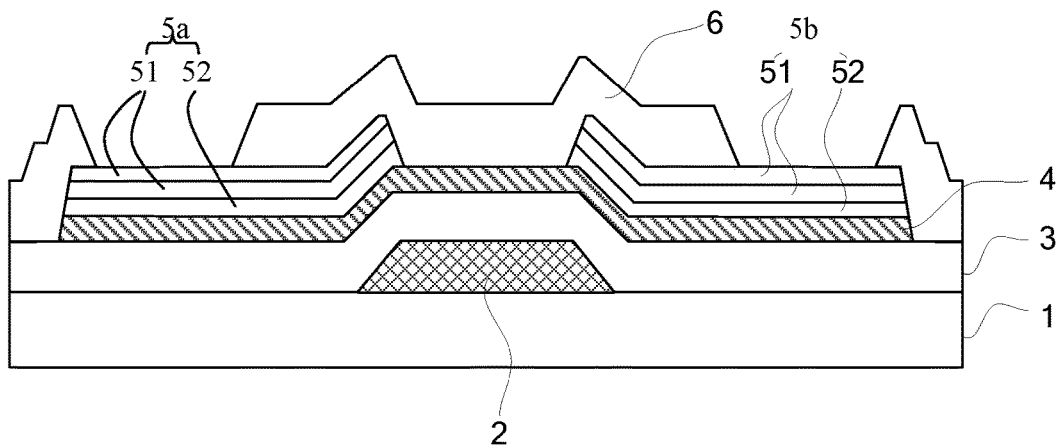

FIG. 1b providing a base substrate, forming a gate metal film on the base substrate, and forming a pattern including a gate electrode by a patterning process — S101 forming a gate insulating layer, an active film and a source electrode and drain electrode film on the base substrate where the step S101 is completed, and forming a pattern including an active layer, a source electrode and a drain electrode by a patterning process, wherein, the source electrode and drain electrode film includes a first conductive film, and an etching rate of a material of the first conductive film is greater than an etching rate of a material of the active layer in an etching liquid — S102

FIG. 2

THIN FILM TRANSISTOR AND FABRICATION METHOD THEREOF, ARRAY SUBSTRATE AND DISPLAY DEVICE

The application is a U.S. National Phase Entry of International Application No. PCT/CN2015/090550 filed on Sep. 24, 2015, designating the United States of America and claiming priority to Chinese Patent Application No. 201510354328.8 filed on Jun. 24, 2015. The present application claims priority to and the benefit of the above-identified applications and the above-identified applications are incorporated by reference herein in their entirety.

TECHNICAL FIELD

Embodiments of the present disclosure relate to a thin film transistor and a fabrication method thereof, an array substrate and a display device.

BACKGROUND

Emerging metal oxide semiconductor TFT with an Indium-Gallium-Zinc Oxide (IGZO) Thin Film Transistor (TFT) as a representative is considered as a device with highest potential in next generation of display technology because it has advantages of both polycrystalline silicon TFT and amorphous silicon TFT. In addition, because the IGZO TFT and the amorphous silicon TFT adopt similar device structures and can be prepared at low temperature, a preparation process of the IGZO TFT can be compatible with a production process of the amorphous silicon TFT, that is to say, a Back Channel Etch (BCE) process which is simple in technological process and low in cost can be adopted to fabricate the IGZO TFT.

SUMMARY

Embodiments of the disclosure provided a thin film transistor and a fabrication method thereof, an array substrate and a display device, so that the problem that the active layer of the thin film transistor is easily corroded in a back channel etch process is avoided and a fabrication process of an oxide thin film transistor is simplified.

According to at least one embodiment of the disclosure, a thin film transistor is provided. The thin film transistor comprises a gate electrode, an active layer, a source electrode and a drain electrode. The source electrode and the drain electrode include a first conductive layer provided on the active layer, and an etching rate of a material of the first conductive layer is greater than an etching rate of a material of the active layer in an etching liquid.

According to at least one embodiment of the disclosure, a fabrication method of a thin film transistor is provided. The method comprises: providing a base substrate, forming a gate metal film on the base substrate, and forming a pattern including a gate electrode by a patterning process; and forming a gate insulating layer, an active film and a source electrode and drain electrode film on the base substrate, and forming a pattern including an active layer, a source electrode and a drain electrode by a patterning process. The source electrode and drain electrode film includes a first conductive film, and an etching rate of a material of the first conductive film is greater than an etching rate of a material of the active layer in an etching liquid.

According to at least one embodiment of the disclosure, an array substrate provided. The array substrate comprises the thin film transistor as described above.

According to at least one embodiment of the disclosure, a display device is provided. The display device comprises the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1a is a structural schematic view illustrating a thin film transistor provided by embodiments of the present disclosure;

FIG. 1b is a structural schematic view illustrating the thin film transistor provided by the embodiments of the present disclosure;

FIG. 2 is a flow view illustrating a fabrication method of a thin film transistor provided by the embodiments of the present disclosure;

DETAILED DESCRIPTION

Figure 3A:
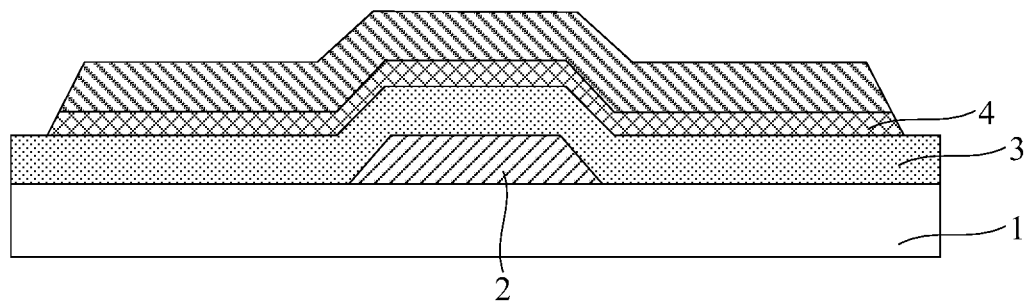
FIG. 3a is a structural schematic view after an active layer is formed by a first patterning process in the fabrication method of the thin film transistor provided by the embodiments of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Inventors of the disclosure found out that: because chemical stability of IGZO is poor, IGZO is easily damaged by etching liquid in the case that IGZO serving as a material for forming an active layer, so that it is hard to implement a BCE (Back Channel Etch) process of an IGZO TFT.

Embodiments of the present disclosure provide a thin film transistor, the thin film transistor comprises an active layer, a source electrode and a drain electrode, the source electrode and the drain electrode include a first conductive layer provided on the active layer, and an etching rate of a material of the first conductive layer is greater than an etching rate of a material of the active layer in a corresponding etching liquid (for example, the corresponding etching liquid is an etching liquid for etching the material for forming the source electrode and the drain electrode; more specifically, the corresponding etching liquid is an etching liquid for etching the material for forming the first conductive layer).

In the thin film transistor described above, the source electrode and the drain electrode include the first conductive layer provided on the active layer, and the etching rate of the material of the first conductive layer is greater than that of the material of the active layer; and thus, by using the difference of the etching rate of the first conductive layer and the etching rate of the active layer, damage of the etching process to the active layer is reduced in the process that the source electrode and the drain electrode are formed by etching, so that the problem that the active layer of the thin film transistor is easily corroded by the etching liquid used in the forming process of the source electrode and the drain electrode is solved. Thus, the thin film transistor provided by the embodiments of the present disclosure is manufactured by using the back channel etch process without arranging an etch blocking layer, so that a number of patterning processes is reduced, and manufacturing cost is reduced. Thus, in the case that the active layer of the TFT provided by the embodiments of the present disclosure is an oxide semiconductor material prone to corrosion, the back channel etch process can be employed with no damage or reduced damage to the active layer, so that the manufacturing process of the oxide semiconductor TFT is simplified.

As shown in FIG. 1a, the thin film transistor provided by at least one embodiment of the present disclosure includes a gate electrode 2, an active layer 4, and a source electrode 5a and a drain electrode 5b which are spaced from each other (position of the source electrode 5a and position of the drain electrode 5b can be exchanged), the source electrode 5a and the drain electrode 5b include a first conductive layer 52 provided on the active layer 4; and in a corresponding etching liquid, an etching rate of a material of the first conductive layer 52 is greater than an etching rate of a material of the active layer 4.

For example, along a direction perpendicular to a plane where the active layer 4 is located, an insulating layer is not provided between the first conductive layer 52 and the active layer 4 (that is to say, the first conductive layer 52 is in direct contact with the active layer 4). The embodiments of the present disclosure can be applied to the thin film transistor manufactured by the back channel etch process, that is to say, in the thin film transistor, the source electrode 5a and the drain electrode 5b are formed after the active layer 4 is formed, and the source electrode 5a and the drain electrode 5b are in direct contact with the active layer 4.

Regarding the problem that the active layer of the thin film transistor in the related art can be easily corroded by the etching liquid used in the procedure of forming the source electrode and the drain electrode, the embodiments of the present disclosure provide the thin film transistor; in the thin film transistor, the source electrode 5a and the drain electrode 5b are provided to include the first conductive layer 52, and the etching rate of the material of the first conductive layer 52 is greater than that of the material of the active layer 4 in the corresponding etching liquid; by using the difference of the above etching rates, damage to the active layer 4 in the back channel etch process is reduced so that the thin film transistor is manufactured by the back channel etch process without arranging an etch blocking layer, a number of patterning processes is reduced, and manufacturing cost is reduced.

As shown in FIG. 1b, for example, in the thin film transistor described above, the source electrode and the drain electrode further include a second conductive layer 51 provided on the first conductive layer 52, and a conductivity of the second conductive layer is greater than a conductivity of the first conductive layer.

In the thin film transistor described above, because the conductivity of the second conductive layer 51 is greater than that of the first conductive layer 52, the conductivity of the source electrode 5a and the drain electrode 5b is not affected by the material of the first conductive layer 52, so as to maintain a good overall conductivity of the source electrode 5a and the drain electrode 5b. In addition, because the second conductive layer 51 good in conductivity and the active layer 4 are spaced each other by the first conductive layer 52, a material of the second conductive layer 51 does not easily diffuse into the active layer 4 to affect performance of the active layer 4.

For example, the second conductive layer 51 that is provided in order to improve the overall conductivity of the source electrode 5a and the drain electrode 5b includes at least one kind of material, and the conductivity of the at least one kind of material is greater than the conductivity of the material of the first conductive layer 52. For example, a high-conductivity material is selected as the at least one kind of material.

In addition, a specific film forming manner of the second conductive layer 51 is not limited; for example, at least two kinds of high-conductivity materials form a mixed material film to serve as the second conductive layer 51; for example, the second conductive layer 51 is formed by a plurality of films stacked on each other, and each film is formed by one kind of high-conductivity material; for example, the second conductive layer 51 is a single layer film, which is formed by one kind of high-conductivity material.

The source electrode 5a and the drain electrode 5b in the thin film transistor described above include the first conductive layer 52 provided on the active layer 4 and the second conductive layer 51 provided on the first conductive layer 52. Because the second conductive layer 51 firstly is etched and then the first conductive layer 52 is etched in the etching process for forming the source electrode 5a and the drain electrode 5b, a portion of the active layer 4 corresponding a channel is not damaged during the second conductive layer 51 is etched. In addition, as long as the etching rate of the material of the first conductive layer 52 is greater than that of the material of the active layer 4 in the corresponding etching liquid, damage of the etching process to the active layer 4 in the process that the source electrode 5a and the drain electrode 5b are formed by etching is reduced by using the difference of the above etching rates. In the above thin film transistor, because the conductivity of the material of the second conductive layer 51 is greater than that of the material of the first conductive layer 52, the conductivity of the formed source electrode 5a and the formed drain electrode 5b is not reduced, and the overall conductivity of the source electrode 5a and the formed drain electrode 5b is good. In addition, because the second conductive layer 51 and the active layer 4 are spaced from each other by the first conductive layer 52, the material of the second conductive layer 51 does not easily diffuse into the active layer 4. In conclusion, the thin film transistor can be manufactured by using the back channel etch process, and overall performance of the thin film transistor is high.

For example, in the thin film transistor disclosed by at least one embodiment, the material of the active layer 4 includes an oxide semiconductor.

For example, the material of the first conductive layer 52 in the source electrode 5a and the drain electrode 5b includes one or more of ZnON (oxygen-doped zinc nitride), ZnO doped with a small amount of Ga, Si, Ge, Ti, Hf, Y, Zr, F or other elements (namely, GaZnO, SiZnO, GeZnO, TiZnO, HfZnO, YZnO, ZrZnO, FZnO), and CdO and a doped system (such as InCdO etc.) thereof.

For example, the material of the second conductive layer 51 in the source electrode 5a and the drain electrode 5b includes one or more of molybdenum (Mo), aluminum (Al), titanium (Ti) and copper (Cu).

For example, in a manufacturing procedure of a large-sized panel, in order to reduce resistance, Cu is generally adopted for wiring; however, in the case that Cu serves as the material of the source electrode 5a and the drain electrode 5b, Cu easily diffuses into the active layer 4 formed by the oxide semiconductor. In the embodiments of the disclosure, the first conductive layer 52 in the source electrode 5a and the drain electrode 5b effectively blocks diffusion of Cu into the active layer 4, thus the performance of the thin film transistor is further improved.

The etching liquid used in the etching process includes an acidic solution or an alkaline solution. According to the difference of the etching rate of the material of the first conductive layer 52 and the etching rate of the material of the active layer 4 in the etching liquid, the acidic solution or the alkaline solution of reasonable concentration is selected so as to reduce damage of the etching process to the active layer 4.

For example, the material of the active layer 4 of the thin film transistor described above is indium gallium zinc oxide; the etching liquid includes one or more of diluted hydrochloric acid, formic acid, acetic acid or tetramethyl ammonium hydroxide, a formic acidic solution, an acetic acidic solution, a tetramethyl ammonium hydroxide (TMAH) solution, a sodium hydroxide solution or a potassium hydroxide solution. According to the difference of the etching rate of the material of the first conductive layer 52 and the etching rate of the material of the active layer 4 in the etching liquid, the acidic solution or alkaline solution of reasonable concentration is selected so as to reduce damage of the etching process to the active layer 4.

For example, the thin film transistor described above is of a bottom gate type, and in such a case, the gate electrode of the thin film transistor is provided on a side of the active layer away from the source electrode/drain electrode. For example, as shown in FIG. 1a, the thin film transistor includes the gate electrode 2 formed on a base substrate 1, a gate insulating layer 3 formed on a side of the gate electrode 2 away from the base substrate 1, the active layer 4 formed on the gate insulating layer 3, and the source electrode 5a and the drain electrode 5b formed on the active layer 4; for example, a passivation layer 6 is formed on the source electrode 5a and the drain electrode 5b, and a contact via hole of the source electrode 5a and the drain electrode 5b is formed in the passivation layer 6.

For example, the thin film transistor described above is of a top gate type, and in such a case, the gate electrode of the thin film transistor is provided on a side the active layer close to the source electrode/drain electrode.

Correspondingly, at least one embodiment of the present disclosure further provides a fabrication method of a thin film transistor; as shown in FIG. 2, the fabrication method for example includes a step S101 and a step S102.

Step S101: providing a base substrate 1, forming a gate metal film on the base substrate 1, and forming a pattern including a gate electrode by a patterning process;

Step S102: forming a gate insulating layer, an active film and a source electrode and drain electrode film on the base substrate 1 on which the step S101 is completed, and forming a pattern including an active layer 4, a source electrode 5a and a drain electrode 5b by a patterning process; the source electrode and drain electrode film includes a first conductive film, and an etching rate of a material of the first conductive film is greater than an etching rate of a material of the active layer 4 in a corresponding etching liquid (for example, the corresponding etching liquid is an etching liquid for etching the source electrode and drain electrode film; more specifically, the corresponding etching liquid is an etching liquid for etching the first conductive film).

The fabrication method is explained by taking that the step S101 is performed first and then the step S102 is performed as an example. The embodiments of the present disclosure are not limited thereto. For example, the step S102 may be performed before the step S101.

In the fabrication method of the thin film transistor described above, in step S102, during the source electrode and drain electrode film formed on the active layer is etched to form the source electrode 5a and the drain electrode 5b, because the etching rate of the material of the first conductive film is greater than that of the material of the active layer 4 in the etching liquid, damage of the etching process forming the source electrode 5a and the drain electrode 5b to the active layer 4 is reduced by using the difference of the etching rates and an etch blocking layer does not need to be provided.

In at least one embodiment, as shown in FIG. 3a, FIG. 3b, FIG. 4a and FIG. 4b, in the fabrication method described above, the step S102 for example includes: forming the gate insulating layer, the active film and the source electrode and drain electrode film on the base substrate 1 (for example, the base substrate 1 is the substrate on which the step S101 is completed), and forming the pattern including the active layer 4, the source electrode 5a and the drain electrode 5b by the patterning process; the source electrode and drain electrode film includes the first conductive film and a second conductive film formed on the first conductive film, the etching rate of the material of the first conductive film is greater than that of the material of the active layer 4 in the etching liquid, and a conductivity of the second conductive film is greater than a conductivity of the first conductive film.

In the fabrication method of the thin film transistor described above, in the step S102, during the source electrode and drain electrode film formed on the active layer is etched to form the source electrode 5a and the drain electrode 5b, the second conductive layer 51 is etched first and then the first conductive layer 52 is etched; and thus, as long as the etching rate of the material of the first conductive layer 52 is greater than that of the material of the active layer 4 in the etching liquid, damage of the etching process to the active layer 4 is reduced by using the difference of the above etching rates, and the etch blocking layer does not need to be provided. In addition, because the conductivity of the second conductive layer 51 is greater than that of the first conductive layer 52, the conductivity of the source electrode 5a and the drain electrode 5b is not lowered, and the overall conductivity is good.

For example, the material of the active layer is an oxide semiconductor such as indium gallium zinc oxide.

For example, the material of the first conductive layer 52 includes one or more of ZnON (oxygen-doped zinc nitride), ZnO doped with a small amount of Ga, Si, Ge, Ti, Hf, Y, Zr, F and other elements (i.e. GaZnO, SiZnO, GeZnO, TiZnO, HfZnO, YZnO, ZrZnO, FZnO), and CdO and a doped system (such as InCdO) thereof.

For example, the material of the second conductive layer 51 includes one or more of Mo, Al, Ti and Cu.

For example, in the step S102, the pattern including the active layer 4, the source electrode 5*a* and the drain electrode 5*b* is formed by multiple patterning processes. For example, the active film is patterned with a normal mask (i.e. a single-tone mask) by a first patterning process, to form a pattern of the active layer 4; then, the source electrode and the drain electrode film is patterned with another normal mask by a second patterning process, to form a pattern of the source electrode 5*a* and the drain electrode 5*b*.

Figure 3B:
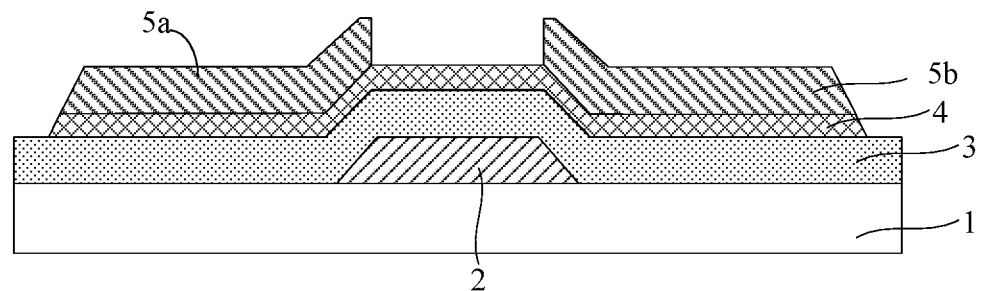
FIG. 3b is a structural schematic view after a source electrode and a drain electrode are formed by a second patterning process in the fabrication method of the thin film transistor provided by the embodiments of the present disclosure.

In at least one embodiment, in the step S102 described above, as shown in FIG. 3*a*, the gate insulating layer and the active film are sequentially deposited on the base substrate 1 by using a plasma enhanced chemical vapor deposition method, then the source electrode and drain electrode film is deposited by a magnetron sputtering method or an evaporation method, then the source electrode and drain electrode film and the active film are patterned with the normal mask by the first patterning process to form the pattern of the active layer 4; as shown in FIG. 3*b*, and then the source electrode and drain electrode film is patterned with another normal mask by the second patterning process to form the pattern of the source electrode 5*a* and the drain electrode 5*b*. Of course, the embodiments of the present disclosure include but not limited thereto. For example, the gate insulating layer is formed on the pattern of the source electrode and the drain electrode after the pattern of the source electrode and the drain electrode is formed.

Figure 4A:
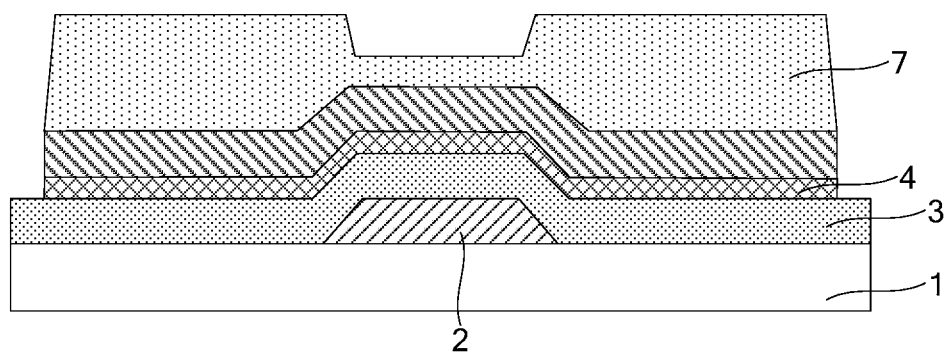
FIG. 4a is a structural schematic view after a pattern including the active layer is formed by a first etching process in the fabrication method of the thin film transistor provided by the embodiments of the present disclosure.
Figure 4B:
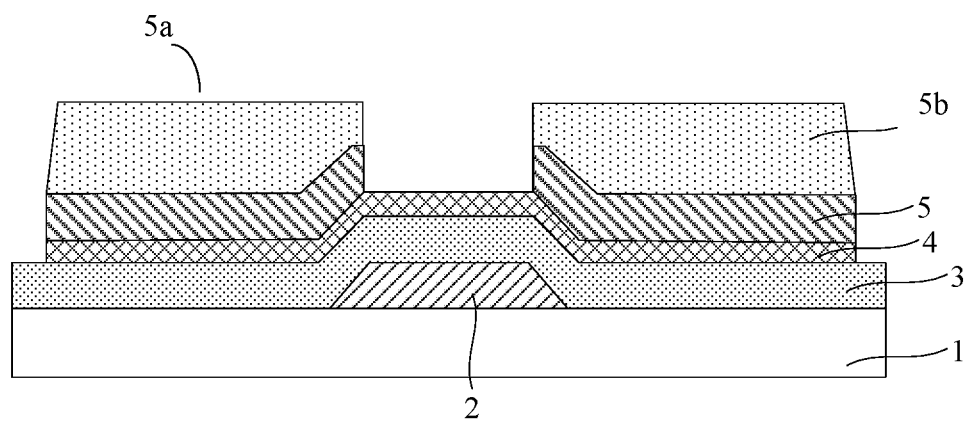
FIG. 4b is a structural schematic diagram after a pattern including the source electrode and the drain electrode is formed by second and third etching process in the fabrication method of the thin film transistor provided by the embodiments of the present disclosure.

For example, in the step S102, the pattern including the active layer 4, the source electrode 5*a* and the drain electrode 5*b* is formed by a single patterning process, as shown in FIG. 4*a* and FIG. 4*b*. For example, in the step S102 described above, the source electrode and drain electrode film is coated with a layer of photoresist 7; as shown in FIG. 4*a*, exposure and development are performed on the photoresist 7 with a dual-tone mask or a gray-tone mask to form a photoresist totally-removed region, a photoresist totally-reserved region and a photoresist partially-reserved region, the photoresist partially-reserved region corresponds to a region where a gap between the source electrode 5*a* and the drain electrode 5*b* is located, the photoresist totally-reserved region corresponds to a region where the pattern of the active layer except for the gap is located, and the photoresist totally-removed region corresponds to a region except for the active layer 4; after development process, a thickness of the photoresist in the photoresist totally-reserved region does not change, the photoresist in the photoresist totally-removed region is totally removed, and a thickness of the photoresist in the photoresist partially-reserved region is reduced; the source electrode and drain electrode film and the active film in the photoresist totally-removed region are totally etched away by a first etching process, to form the pattern including the active layer 4; as shown in FIG. 4*b*, the photoresist in the photoresist partially-reserved region is removed by an ashing process so as to expose the source electrode and drain electrode film in the photoresist partially-reserved region; the second conductive film of the source electrode and drain electrode film in the photoresist partially-reserved region is totally etched away by a second etching process and the first conductive film of the source electrode and drain electrode film in the photoresist partially-reserved region is totally etched away by a third etching process, to form the pattern including the source electrode 5*a* and the drain electrode 5*b*; and a remaining portion of the photoresist is stripped off. By using the method described above, a number of the masks adopted in the fabrication process is reduced, a number of times of coating the photoresist is reduced, and therefore the fabrication process is simplified.

For example, in the case shown in FIG. 4*a* and FIG. 4*b*, before coating the photoresist, the gate insulating layer and the active film are sequentially deposited on the base substrate by using the plasma enhanced chemical vapor deposition method, and then the source electrode and drain electrode film is deposited by using the magnetron sputtering method or the evaporation method. Of course, the embodiments of the present disclosure include but not limited thereto. For example, the gate insulating layer is formed on the pattern of the source electrode and the drain electrode after the pattern of the source electrode and the drain electrode is formed.

In at least one embodiment, in the fabrication process of the thin film transistor described above, a dry etching is adopted for the second etching process, and a wet etching is adopted for the third etching process. That is to say, the dry etching process is performed first on the second conductive layer 51 formed of a metal material, then the corresponding etching liquid is used for performing the wet etching process on the first conductive layer 52 so as to guarantee precision upon the second conductive layer 51 and the first conductive layer 52 being formed by etching.

For example, the etching liquid in the wet etching process described above is an acidic solution or an alkaline solution.

For example, the etching liquid in the wet etching process described above is a hydrochloric acidic solution, a formic acidic solution, an acetic acidic solution, a tetramethylammonium hydroxide (TMAH) solution, a sodium hydroxide solution or a potassium hydroxide solution.

At least one embodiment of the present disclosure further provides an array substrate, the array substrate comprising the thin film transistor provided in any embodiment described above.

For example, the array substrate provided by the embodiments of the present disclosure is an array substrate of any type, as long as the array substrate includes the thin film transistor provided by any embodiment described above.

For example, the array substrate is an array substrate of a liquid crystal display device, and in such case, the array substrate further includes a pixel electrode. In some examples, the array substrate further includes a common electrode.

For example, the array substrate is an array substrate of an OLED display device, and in such case, the array substrate further includes OLED units provided in a matrix, for example, each OLED unit includes an anode, a cathode and a light-emitting layer provided between the anode and the cathode.

For example, the array substrate provided by the embodiments of the present disclosure further includes a plurality of gate lines and a plurality of data lines intersecting with each other, and other structures, which is not described in detail herein.

At least one embodiment of the present disclosure further provides a display device. The display device for example includes: the array substrate in the embodiments described above. A number of patterning processes of the display device is small, and the cost is low. For example, the display device includes a liquid crystal display panel, an electronic paper, an OLED panel, a mobile phone, a tablet personal computer, a TV set, a display, a laptop, a digital photo frame, a navigator or any product or part with a display function.

In order to describe clearly, the present disclosure adopts words such as "first" and "second" to classify and distinguish similar items, but the words such as "first" and "second" do not limit the present disclosure in terms of quantity, and are only to exemplify an optional manner. The similar variants or relevant expansions which can be obviously thought out by a person skilled in the art all belong to the protection scope of the present disclosure.

It is evident that a person skilled in the art can make various changes or modifications to the present invention without departing from the spirit and scope of the present disclosure. Thus, if such changes and modifications to the present invention are within the scope of the claims of the present invention and equivalent thereof, the present disclosure also intends to include all such changes and modifications within its scope.

The present application claims priority of Chinese Patent Application No. 201510354328.8 filed on Jun. 24, 2015, the present disclosure of which is incorporated herein by reference in its entirety as part of the present application.

The invention claimed is:

1. A thin film transistor, comprising a gate electrode, an active layer, a source electrode, and a drain electrode, wherein,
    the source electrode and the drain electrode each include a first conductive layer and a second conductive layer;
    the first conductive layer is provided on the active layer and directly contacts the active layer;
    in an etching liquid, an etching rate of a material of the first conductive layer is greater than an etching rate of a material of the active layer;
    the second conductive layer is provided on a side, facing away from the active layer, of the first conductive layer and does not directly contact the active layer, wherein a conductivity of the second conductive layer is greater than a conductivity of the first conductive layer; and
    the material of the first conductive layer comprises one or more of oxygen-doped zinc nitride, silicon-doped zinc oxide, germanium-doped zinc oxide, titanium-doped zinc oxide, hafnium-doped zinc oxide, yttrium-doped zinc oxide, zirconium-doped zinc oxide, and indium-doped cadmium oxide.

2. The thin film transistor according to claim 1, wherein, the material of the active layer includes an oxide semiconductor; and
    the etching liquid includes an acidic solution or an alkaline solution.

3. The thin film transistor according to claim 2, wherein, the material of the active layer includes indium gallium zinc oxide; and the etching liquid includes hydrochloric acid, formic acid, acetic acid or tetramethyl ammonium hydroxide.

4. The thin film transistor according to claim 1, wherein, the material of the active layer includes an oxide semiconductor.

5. The thin film transistor according to claim 1, wherein, the etching liquid includes an acidic solution or an alkaline solution.

6. The thin film transistor according to claim 1, wherein, a material of the second conductive layer includes one or more of molybdenum, aluminum, titanium, and copper.

7. The thin film transistor according to claim 1, wherein, an insulating layer is not provided between the first conductive layer and the active layer along a direction perpendicular to a plane where the active layer is located.

8. An array substrate, comprising the thin film transistor according to claim 1.

9. A display device, comprising the array substrate according to claim 8.

10. A fabrication method of a thin film transistor, comprising:
    providing a base substrate, forming a gate metal film on the base substrate, and forming a pattern including a gate electrode by a patterning process; and
    forming a gate insulating layer, an active film, and a source electrode and drain electrode film on the base substrate, and forming a pattern including an active layer, a source electrode, and a drain electrode by a patterning process,
    wherein, the source electrode and drain electrode film includes a first conductive film and a second conductive film,
    the first conductive film is provided on the active film and directly contacts the active film,
    in an etching liquid, an etching rate of a material of the first conductive film is greater than an etching rate of a material of the active film,
    the second conductive film is formed on a side, facing away from the active film, of the first conductive film and does not directly contact the active film, wherein a conductivity of the second conductive film is greater than a conductivity of the first conductive film, and
    the material of the first conductive film includes one or more of oxygen-doped zinc nitride, silicon-doped zinc oxide, germanium-doped zinc oxide, titanium-doped zinc oxide, hafnium-doped zinc oxide, yttrium-doped zinc oxide, zirconium-doped zinc oxide, and indium-doped cadmium oxide.

11. The fabrication method of the thin film transistor according to claim 10, wherein,
    the material of the active film includes an oxide semiconductor; and
    the etching liquid includes an acidic solution or an alkaline solution.

12. The fabrication method of the thin film transistor according to claim 10, wherein, a material of the second conductive film includes one or more of molybdenum, aluminum, titanium, and copper.

13. The fabrication method of the thin film transistor according to claim 10, wherein,
    the active film is patterned with a normal mask by a first patterning process, to form a pattern including the active layer; and
    the source electrode and drain electrode film is patterned with another normal mask by a second patterning process, to form a pattern including the source electrode and the drain electrode.

14. The fabrication method of the thin film transistor according to claim 10, wherein,
    the source electrode and drain electrode film is coated with a layer of photoresist;
    exposure and development are performed on the photoresist with a dual-tone mask or a gray-tone mask to form a photoresist totally-removed region, a photoresist totally-reserved region, and a photoresist partially-reserved region, wherein the photoresist partially-reserved region corresponds to a region where a gap between the source electrode and the drain electrode is located, the photoresist totally-reserved region corresponds to a region where the pattern of the active layer except for the gap is located, and the photoresist totally-removed region corresponds to a region except for the active layer, and wherein after the development, a thickness of the photoresist in the photoresist totally-reserved region does not change, the photoresist in the photoresist totally-removed region is totally removed, and a thickness of the photoresist in the photoresist partially-reserved region is reduced;

the source electrode and drain electrode film and the active film in the photoresist totally-removed region are totally etched away by a first etching process, to form a pattern including the active layer;

the photoresist in the photoresist partially-reserved region is removed by an ashing process so as to expose the source electrode and drain electrode film in the photoresist partially-reserved region;

the second conductive film of the source electrode and drain electrode film in the photoresist partially-reserved region is totally etched away by a second etching process;

the first conductive film of the source electrode and drain electrode film in the photoresist partially-reserved region is totally etched away by a third etching process, to form a pattern including the source electrode and the drain electrode; and a remaining portion of the photoresist is stripped off.

15. The fabrication method of the thin film transistor according to claim 14, wherein, a dry etching is adopted for the second etching process; and wet etching is adopted for the third etching process.

16. The fabrication method of the thin film transistor according to claim 10, wherein, the gate insulating layer and the active film are sequentially deposited on the base substrate by using a plasma enhanced chemical vapor deposition method, and the source electrode and drain electrode film is deposited by using a magnetron sputtering method or an evaporation method.

17. A fabrication method of a thin film transistor, comprising:

providing a base substrate, forming a gate metal film on the base substrate, and forming a pattern including a gate electrode by a patterning process; and forming a gate insulating layer, an active film, and a source electrode and drain electrode film on the base substrate, and forming a pattern including an active layer, a source electrode, and a drain electrode by a patterning process, wherein, the source electrode and drain electrode film includes a first conductive film, and, in an etching liquid, an etching rate of a material of the first conductive film is greater than an etching rate of a material of the active layer;

the source electrode and drain electrode film further includes a second conductive film formed on the first conductive film, wherein a conductivity of the second conductive film is greater than a conductivity of the first conductive film; and wherein the forming the pattern including the active layer, the source electrode, and the drain electrode comprises:

forming a layer of photoresist on the source electrode and drain electrode film;

performing exposure and development on the photoresist with a dual-tone mask or a gray-tone mask to form a photoresist totally-removed region, a photoresist totally-reserved region, and a photoresist partially-reserved region, wherein the photoresist partially-reserved region corresponds to a region where a gap between the source electrode and the drain electrode is located, the photoresist totally-reserved region corresponds to a region where the pattern of the active layer except for the gap is located, and the photoresist totally-removed region corresponds to a region except for the active layer, and wherein after the development, a thickness of the photoresist in the photoresist totally-reserved region does not change, the photoresist in the photoresist totally-removed region is totally removed, and a thickness of the photoresist in the photoresist partially-reserved region is reduced;

totally etching away the source electrode and drain electrode film and the active film in the photoresist totally-removed region by a first etching process, to form the active layer;

removing the photoresist in the photoresist partially-reserved region by an ashing process so as to expose the source electrode and drain electrode film in the photoresist partially-reserved region;

totally etching away the second conductive film of the source electrode and drain electrode film in the photoresist partially-reserved region by a second etching process;

totally etching away the first conductive film of the source electrode and drain electrode film in the photoresist partially-reserved region by a third etching process, to form the source electrode and the drain electrode; and stripping off a remaining portion of the photoresist.

18. The fabrication method of the thin film transistor according to claim 17, wherein, a dry etching is adopted for the second etching process; and wet etching is adopted for the third etching process.

* * * * *